United States Patent
Abbott, Jr. et al.

(10) Patent No.: US 11,279,129 B2
(45) Date of Patent: Mar. 22, 2022

(54) AMORPHOUS THIN METAL FILM

(71) Applicants: HEWLETT-PACKARD DEVELOPMENT COMPANY, L.P., Houston, TX (US); The State of Oregon State Board of Higher Education on behalf of Oregon State University, Corvallis, OR (US)

(72) Inventors: James Elmer Abbott, Jr., Corvallis, OR (US); John M McGlone, Corvallis, OR (US); Kristopher Olsen, Corvallis, OR (US); Douglas A Keszler, Corvallis, OR (US); John Wager, Corvallis, OR (US); Roberto A Pugliese, Tangent, OR (US); William F Stickle, Corvallis, OR (US); Greg Scott Long, Corvallis, OR (US)

(73) Assignees: Hewlett-Packard Development Company, L.P., Spring, TX (US); Oregon State University, Corvallis, OR (US)

( * ) Notice: Subject to any disclaimer, the term of this patent is extended or adjusted under 35 U.S.C. 154(b) by 641 days.

(21) Appl. No.: 16/067,945

(22) PCT Filed: Jun. 24, 2016

(86) PCT No.: PCT/US2016/039174
§ 371 (c)(1),
(2) Date: Jul. 3, 2018

(87) PCT Pub. No.: WO2017/222545
PCT Pub. Date: Dec. 28, 2017

(65) Prior Publication Data
US 2020/0270742 A1    Aug. 27, 2020

(51) Int. Cl.
*B41J 2/14* (2006.01)
*C22C 45/00* (2006.01)
(Continued)

(52) U.S. Cl.
CPC .......... *B41J 2/14129* (2013.01); *C22C 45/00* (2013.01); *C23C 14/14* (2013.01); *H01B 1/02* (2013.01);
(Continued)

(58) Field of Classification Search
CPC ... B41J 2/14129; B41J 2202/03; C22C 45/00; C23C 14/14; B32B 15/00; H01B 1/02; H01B 5/02
See application file for complete search history.

(56) References Cited

U.S. PATENT DOCUMENTS

| | | |
|---|---|---|
| 4,965,611 A | 10/1990 | Pan et al. |
| 5,448,273 A | 9/1995 | Klein et al. |

(Continued)

FOREIGN PATENT DOCUMENTS

| | | | | |
|---|---|---|---|---|
| TW | 201505860 A | 2/2015 | | |
| WO | WO 2015/005933 A1 * | 1/2015 | ............. | B41J 2/335 |

(Continued)

*Primary Examiner* — Geoffrey S Mruk
(74) *Attorney, Agent, or Firm* — Thorpe North & Western LLP

(57) ABSTRACT

An amorphous thin metal film can comprise a combination of three metals or metalloids including: 5 at % to 90 at % of a metalloid selected from the group of carbon, silicon, and boron; 5 at % to 90 at % of a first metal selected from the group of titanium, vanadium, chromium, iron, cobalt, nickel, zirconium, niobium, molybdenum, ruthenium, rhodium, palladium, hafnium, tantalum, tungsten, osmium, iridium, and platinum; and 1 at % to 90 at % of cerium. The three elements may account for at least 50 at % of the amorphous thin metal film.

15 Claims, 4 Drawing Sheets

(51) Int. Cl.
*H01B 1/02* (2006.01)
*C23C 14/14* (2006.01)
*H01B 5/02* (2006.01)
*B32B 15/00* (2006.01)

(52) U.S. Cl.
CPC ................ *H01B 5/02* (2013.01); *B32B 15/00* (2013.01); *B41J 2202/03* (2013.01)

(56) References Cited

U.S. PATENT DOCUMENTS

| | | |
|---|---|---|
| 6,350,017 B1 | 2/2002 | Kamada |
| 7,773,365 B2 | 8/2010 | Herman et al. |
| 9,076,479 B2 | 7/2015 | Katano et al. |

FOREIGN PATENT DOCUMENTS

| | | |
|---|---|---|
| WO | WO-2015005932 A1 | 1/2015 |
| WO | WO-2015005933 A1 | 1/2015 |

* cited by examiner

AMORPHOUS THIN METAL FILM

BACKGROUND

Thin metal films can be used in various applications such as electronic semiconductor devices, optical coatings, and printing technologies. As such, once deposited, thin metal films can be subjected to harsh environments. For example, such thin films may be subjected to high heat, corrosive chemicals, etc.

In a typical inkjet printing system, an inkjet printhead ejects fluid (e.g., ink) droplets through a plurality of nozzles toward a print medium, such as a sheet of paper or other substrate, to print an image onto the print medium. The nozzles are generally arranged in one or more arrays or patterns, such that properly sequenced ejection of ink from the nozzles causes characters or other images to be printed on the print medium as the printhead and the print medium are moved relative to one another.

Because the ejection process is repeated thousands of times per second during printing, collapsing vapor bubbles can contribute to an adverse effect of damaging the heating element. The repeated collapsing of the vapor bubbles leads to cavitation damage to the surface material that coats the heating element. Each of these collapse events can thus contribute to ablation of the coating material. Once ink penetrates the surface material coating the heating element and contacts the hot, high voltage resistor surface, rapid corrosion and physical destruction of the resistor soon follows, rendering the heating element ineffective. There are also other examples of systems, outside of the inkjet arts, where structures may undergo contact with harsh environments. As such, research and development continues in the area of thin metal films used in various applications that can provide improved performance.

BRIEF DESCRIPTION OF THE DRAWINGS

Additional features and advantages of the present disclosure will be apparent from the detailed description which follows, taken in conjunction with the accompanying drawings, which together illustrate, by way of example, features of the present technology.

Figure 1:
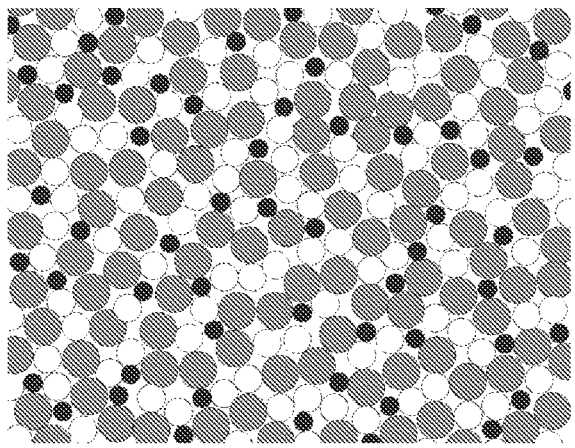
FIG. 1 shows an example schematic cross-sectional view of a distribution of elements of a three component amorphous thin metal film in accordance with the present disclosure.

Reference will now be made to the examples described and illustrate herein, and specific language will be used herein to describe the same. It will nevertheless be understood that no limitation of the scope of the present disclosure is thereby intended.

DETAILED DESCRIPTION

Amorphous thin metal films that can be stable having robust chemical, thermal, and mechanical properties are disclosed. As many thin metal films have a crystalline structure that possess grain boundaries and a rough surface, there are certain films disclosed herein that can be more robust and which are amorphous in character. Grain boundaries and rough surfaces can hamper the thin metal film's chemical, thermal, and mechanical properties. Thus, in accordance with the present disclosure, thin metal films can be made from a multi-component system, such as a three or four (or even five or six) component system, providing a stable and amorphous structure having superior chemical, thermal, and mechanical properties.

In accordance with this, the present disclosure is drawn to an amorphous thin metal film including a combination of a plurality of components or elements. It is noted that when discussing an amorphous thin metal film, a method of manufacturing an amorphous thin metal film, or a thermal inkjet printhead stack with an amorphous thin metal film, each of these discussions can be considered applicable to these examples, whether or not they are explicitly discussed in the context of that example. Thus, for example, in discussing a metalloid for an amorphous thin metal film, such a metalloid can also be used in a method of manufacturing an amorphous thin metal film or a thermal inkjet printhead stack with an amorphous thin metal film, and vice versa.

As such, with the present discussion in mind, an amorphous thin metal film can include a combination of elements such as: 5 atomic % (or "at %") to 90 at % of a metalloid that can be carbon, silicon, or boron; 5 at % to 90 at % of a first metal that can be titanium, vanadium, chromium, iron, cobalt, nickel, zirconium, niobium, molybdenum, ruthenium, rhodium, palladium, hafnium, tantalum, tungsten, osmium, iridium, or platinum; and 1 at % to 90 at % of cerium. Generally, the three elements account for at least 50 at % of the amorphous thin metal film, or alternatively, at least 70 at % of the amorphous thin metal film. In one example, two of the three elements can account for at least 50 at % of the amorphous thin metal film, or at least 70 at % of the amorphous thin metal film. This range of metalloid, first metal, and cerium, can likewise be independently modified at the lower end to 10 at %, or 20 at %, and/or at the upper end to 40 at %, 50 at %, 70 at %, or 80 at %. Furthermore, in one example, the metalloid, the first metal, and cerium can account for at least 80 at %, at least 90 at %, or even 100 at % of the amorphous thin metal film. In one example, the amorphous thin metal film can further include from 5 at % to 90 at % of a second metal, wherein the second metal can be titanium, vanadium, chromium, iron, cobalt, nickel, zirconium, niobium, molybdenum, ruthenium, rhodium, palladium, hafnium, tantalum, tungsten, osmium, iridium, or platinum, and wherein the first metal and the second metal can be different metals, and wherein the metalloid, the first metal, the second metal, and cerium can account for at least 70 at % of the amorphous thin metal film.

The present mixture of elements can be mixed in a manner and in quantities such that the mixture is homogenous. Additionally, the mixture can be sintered and further applied to a suitable substrate using deposition techniques. Generally, the resulting thin metal film is amorphous. By using three or more components (or four or more components, or five or more components, etc.) in high enough concentrations, a "confusion" of sizes and properties disfavors the formation of lattice structures that are more typical in single component or even two component systems. Selecting components with suitable size differentials can contribute to minimizing crystallization of the structure. For example, the amorphous thin metal film can have an atomic dispersity of at least 12% between two of the plurality of elements. In another aspect, the amorphous thin metal film can have an atomic dispersity of at least 12% between all of the plurality of elements, e.g., metalloid, first metal, cerium, second metal (if present), etc. As used herein, "atomic dispersity" refers to the difference in size between the radii of two atoms. In one example, the atomic dispersity can be at least 15%, and in one aspect, can be at least 20%. The atomic dispersity between components can contribute to the exceptional properties of the present films, including thermal stability, oxidative stability, chemical stability, and surface roughness, which are not achieved by typical thin metal films. Oxidative stability can be measured by the amorphous thin metal film's oxidation temperature and/or oxide growth rate as discussed herein.

Figure 2:
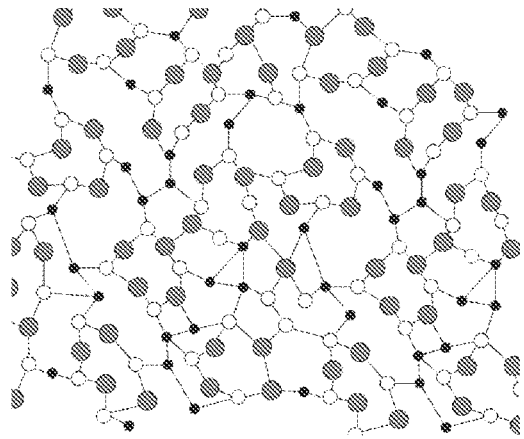
FIG. 2 shows an example of a lattice structure of a three component amorphous thin metal film in accordance with the present disclosure.

Turning now to FIG. 1, the present thin metal films can have a distribution of components with an atomic dispersity as represented in FIG. 1. Notably, the present thin metal films can be generally amorphous with a smooth, grain-free structure. Likewise, the lattice structure of the amorphous thin metal films can be represented by FIG. 2 as compared to typical films with a more crystalline lattice structure having grain boundaries.

Figure 3:
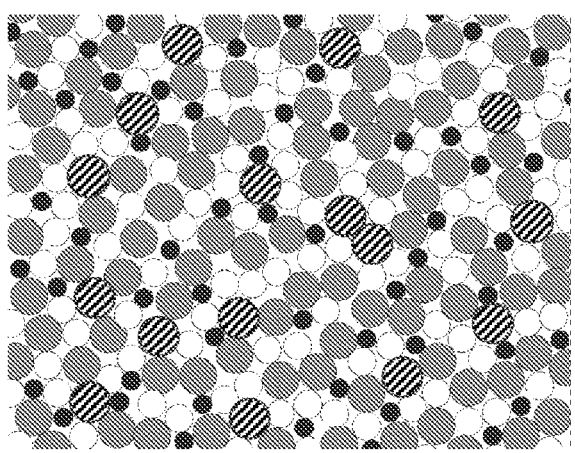
FIG. 3 shows an example schematic cross-sectional view of a distribution of elements of a four component amorphous thin metal film in accordance with the present disclosure.
Figure 4:
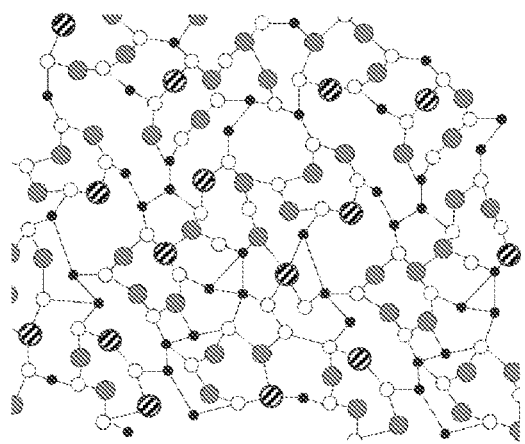
FIG. 4 shows an example of a lattice structure of a four component amorphous thin metal film in accordance with the present disclosure.

As shown in FIG. 3, these thin metal films include a second metal (for a total of four components), and these component can have a distribution of components with an atomic dispersity as shown therein. As previously mentioned, the present thin metal films can be generally amorphous with a smooth, grain-free structure. Thus, where the thin metal film includes a second metal, the lattice structure can be represented by FIG. 4. Additional metals can likewise be included, such as a third (different) metal and/or a fourth (different) metal, etc.

As discussed herein, these amorphous thin metal films can have acceptable properties including thermal stability, oxidative stability, and surface roughness. In one example, the present thin metal films can have a root mean square (RMS) roughness of less than 1 nm. In one aspect, the RMS roughness can be less than 0.5 nm. In another aspect, the RMS roughness can be less than 0.1 nm. One method to measure the RMS roughness includes measuring atomic force microscopy (AFM) over a 100 nm by 100 nm area. In other aspects, the AFM can be measured over a 10 nm by 10 nm area, a 50 nm by 50 nm area, or a 1 micron by 1 micron area. Other light scattering techniques can also be used such as x-ray reflectivity or spectroscopic ellipsometry.

In another example, the amorphous thin metal film can have a thermal stability of at least 700° C. In one aspect, the thermal stability can be at least 800° C. In another aspect, the thermal stability can be at least 900° C., or at least 1000° C. As used herein, "thermal stability" refers to the maximum temperature that the amorphous thin metal film can be heated while maintaining an amorphous structure. One method to measure the thermal stability includes sealing the amorphous thin metal film in a quartz tube, heating the tube to a temperature, and using x-ray diffraction to evaluate the atomic structure and degree of atomic ordering.

In still another example, the amorphous thin metal film can resist oxidation at high temperatures. For example, the amorphous thin metal film can resist oxidation at temperatures of 300° C., 400° C., or 500° C. in an oxidative environment. One method to measure the oxide growth rate is to heat the amorphous thin metal film under air (20% oxygen) at an elevated temperature and measure the amount of oxidation on the amorphous thin metal film using spectroscopic ellipsometry periodically.

Depending on the components and the method of manufacture, the amorphous thin metal film can have a wide range of electric resistivity, including ranging from about 100 $\mu\Omega\cdot cm$ to about 2000 $\mu\Omega\cdot cm$, from about 200 $\mu\Omega\cdot cm$ to about 10,000 $\mu\Omega\cdot cm$, from about 1000 $\mu\Omega\cdot cm$ to about 8000 $\mu\Omega\cdot cm$, or from about 2000 $\mu\Omega\cdot cm$ to about 6000 $\mu\Omega\cdot cm$.

Generally, the amorphous thin metal film can have a positive heat of mixing. As discussed herein, the present thin metal films generally include a metalloid, a first metal, and cerium, where the first metal can include elements selected from Periodic Table Groups IV, V, VI, VIII, IX, and X (4, 5, 6, 8, 9, and 10).

In some examples, the amorphous thin metal film can also include from 5 at % to 90 at % of a second metal, as mentioned previously (as shown in FIGS. 3 and 4). The second metal can include metals such as titanium, vanadium, chromium, iron, cobalt, nickel, zirconium, niobium, molybdenum, ruthenium, rhodium, palladium, hafnium, tantalum, tungsten, osmium, iridium, or platinum. In this example, the second metal can be different than the first metal. This range of the second metal can likewise be independently modified at the lower end to 10 at %, or 20 at %, and/or at the upper end to 80 at %, or 70 at %. Furthermore, in one example, the metalloid, the first metal, cerium, and the second metal can account for at least 70 at %, at least 80 at %, at least 90 at %, or even 100 at % of the amorphous thin metal film.

In another example, the amorphous thin metal films can include a refractory metal selected from the group of titanium, vanadium, chromium, zirconium, niobium, molybdenum, ruthenium, rhodium, hafnium, tantalum, tungsten, osmium, and iridium. In one example, the first and/or second metal can be a refractory metal, respectively.

In one aspect, the first and/or second metal can be present in the thin film in an amount ranging from 20 at % to 90 at %. In another aspect, the first and/or second metal can be present in the thin film in an amount ranging from 20 at % to 70 at %. In some examples, where the second metal is included in the thin film, the first metal can be present in the thin film in an amount ranging from 10 at % to 50 at % and the second metal can be present in the thin film in an amount ranging from 10 at % to 40 at %.

As mentioned, cerium can be present in the thin film in an amount ranging from 1 at % to 90 at %. In other examples, cerium can be present in the thin film in an amount ranging from about 2 at %, 3 at %, 4 at %, or 5 at % to about 70 at %, 75 at %, 80 at %, or 85 at %. It is noted that cerium can form a stable, chemically resistant oxide material, even in high temperature and chemically reactive environments. As such, cerium can form a chemically stable oxide and can help improve the robustness of the final film at high temperatures and/or in chemically reactive environments.

Additionally, in some examples, the amorphous thin metal films can further include a dopant. In one example, the dopant can include nitrogen, oxygen, and mixtures thereof. The dopant can generally be present in the amorphous thin metal film in an amount ranging from 0.1 at % to 25 at %. In one example, the dopant can be present in an amount ranging from 0.1 at % to 15 at %. In one example, the dopant can be present in an amount ranging from 0.1 at % to 5 at %. Smaller amounts of dopants can also be present, but at such low concentrations, they would typically be considered impurities. Additionally, in one aspect, the amorphous thin metal film can be devoid of aluminum, silver, and gold.

Generally, the amorphous thin metal film can have a thickness ranging from 10 angstroms to 100 microns. In one example, the thickness can be from 10 angstroms to 2 microns. In one aspect, the thickness can be from 0.02 microns to 2 microns. In one aspect, the thickness can be from 0.05 microns to 0.5 microns.

Turning now to a method of manufacturing, the method can include depositing an amorphous thin metal film to a substrate, the amorphous thin metal film, comprising: a metalloid, a first metal, and cerium to a substrate to form the amorphous thin metal film. The thin metal film can include 5 at % to 90 at % of the metalloid selected from the group of carbon, silicon, and boron; 5 at % to 90 at % of the first metal selected from the group of titanium, vanadium, chromium, iron, cobalt, nickel, zirconium, niobium, molybdenum, ruthenium, rhodium, palladium, hafnium, tantalum, tungsten, osmium, iridium, or platinum; and 1 at % to 90 at % of cerium. The metalloid, the first metal, and cerium may account for at least 50 at % of the amorphous thin metal film.

In some examples, the method can also include depositing a second metal selected from the group of titanium, vanadium, chromium, iron, cobalt, nickel, zirconium, niobium, molybdenum, ruthenium, rhodium, palladium, hafnium, tantalum, tungsten, osmium, iridium, or platinum.

In another example, prior to depositing, the metalloid, the first metal, cerium, and in some examples a second metal, third metal, etc., the components can be mixed to form a blend that can be subsequently deposited.

Generally, the step of depositing can include sputtering, atomic layer deposition, chemical vapor deposition, electron beam deposition, ion beam deposition, or thermal evaporation. In one example, the depositing can be sputtering. The sputtering can generally be performed at from 1 mTorr to 20 mTorr or from 5 mTorr to 15 mTorr at a deposition rate of 5 to 10 nm/min with the target approximately 4 inches from a stationary substrate. Other deposition conditions may be used and other deposition rates can be achieved depending on variables such as target size, electrical power used, pressure, sputter gas, target to substrate spacing, and a variety of other deposition system dependent variables. In another aspect, depositing can be performed in the presence of a dopant that can be incorporated into the thin film. In another specific aspect, the dopant can be oxygen and/or nitrogen.

Notably, it has been recognized that amorphous thin metal films as discussed herein can have acceptable properties related to thermal stability, oxidative stability, chemical stability, and surface roughness for use in hot and harsh environments described herein. As such, the present thin metal films can be used in a number of applications including electronic semiconductor devices, optical coatings, and printing technologies, for example.

In one specific example, the amorphous thin metal film can be used in a thermal inkjet printhead stack as a resistor, a protective layer, or both. The thermal inkjet printhead stack can comprise an insulated substrate, a resistor applied to the insulated substrate, a resistor passivation layer applied over the resistor, and a protective layer applied over the resistor passivation layer. The amorphous thin metal film can include from 5 at % to 90 at % of a metalloid of carbon, silicon, or boron; from 5 at % to 90 at % of a first metal of titanium, vanadium, chromium, iron, cobalt, nickel, zirconium, niobium, molybdenum, ruthenium, rhodium, palladium, hafnium, tantalum, tungsten, osmium, iridium, or platinum; and from 1 at % to 90 at % of cerium. The metalloid, the first metal, and cerium can account for at least 50 at % of the amorphous thin metal film.

In some examples, the amorphous thin metal film can also include from 5 at % to 90 at % of a second metal (or a third metal, a fourth metal, etc). The second metal (or other additional metal) can include metals such as titanium, vanadium, chromium, iron, cobalt, nickel, zirconium, niobium, molybdenum, ruthenium, rhodium, palladium, hafnium, tantalum, tungsten, osmium, iridium, or platinum. In this example, the second or other additional metal(s) can be different than the first metal. These ranges of metalloid, first metal, cerium, and second metal (if present) can likewise be independently modified at the lower end to 10 at %, or 20 at %, and/or at the upper end to 80 at %, or 70 at %. Furthermore, in one example, the metalloid, the first metal, cerium, and the second metal can account for at least 70 at %, at least 80 at %, at least 90 at %, or even 100 at % of the amorphous thin metal film.

In some examples, the resistor can be an amorphous thin metal resistor. The amorphous thin metal resistor can be applied at a thickness ranging from about 0.02 microns to about 0.5 microns, about 0.02 microns to about 0.3 microns, or other suitable range. In some examples, the amorphous thin metal resistor can have an electrical resistivity of from about 200 $\mu\Omega\cdot cm$ to about 10,000 $\mu\Omega\cdot cm$, from about 1000 $\mu\Omega\cdot cm$ to about 8000 $\mu\Omega\cdot cm$, or from about 2000 $\mu\Omega\cdot cm$ to about 6000 $\mu\Omega\cdot cm$.

In some examples, the protective layer can be an amorphous thin metal protective layer. The amorphous thin metal protective layer can be applied at a thickness ranging from about 0.02 microns to about 2 microns, about 0.05 microns to about 1.5 microns, or other suitable range.

In some examples, both the resistor and the protective layer can be amorphous thin metal films, respectively. It is noted that where both the resistor and the protective layer are amorphous thin metal films, the composition of the amorphous thin metal resistor and the amorphous thin metal protective layer need not be the same, but can be the same where desirable. For example, in some cases, the amorphous thin metal resistor can include oxygen, nitrogen, or both at a greater or lesser atomic percentage than the amorphous thin metal protective layer. In another example, the amorphous thin metal resistor can include cerium at a greater or lesser atomic percentage than the amorphous thin metal protective layer. In yet another example, the amorphous thin metal resistor can include the metalloid, first metal, the second metal, or a combination thereof at greater or lesser respective atomic percentages than the amorphous thin metal protective layer.

The thermal printhead stack can also include a pair of conductors electrically coupled with the resistor. In this example, the pair of conductors may also include passivation layers, respectively, applied to a top surface of the pair of conductors. Thus, when both the conductors are coated with dielectric or passivation layers, a common passivation or electrically insulating film can be used for both the conductors and the resistor, or separate material coating layers can be used.

Figure 5:
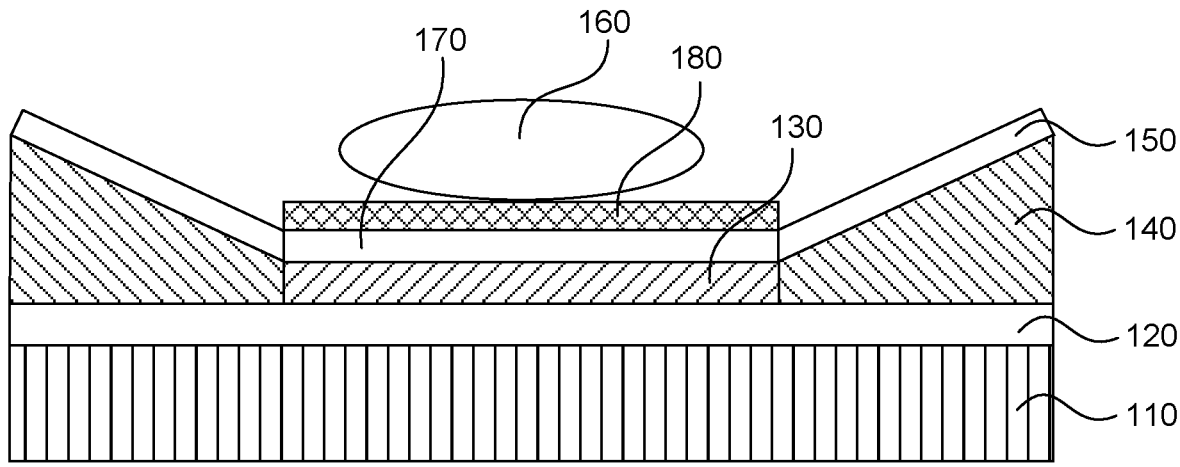
FIG. 5 is an example cross-sectional schematic view of a portion of a thermal inkjet printhead stack in accordance with the present disclosure.

Turning now to FIG. 5, an example structure is shown that can be suitable for a thin film stack for use in a thermal inkjet printhead. Specifically, a silicon wafer 110 is shown having an electrical insulating layer 120 applied thereto. To the insulating layer is applied the resistor 130, which can be prepared using any known resistor material known in the thermal inkjet printing arts, such as TaAl, WSiN, TaSiN, TaN, or $Ta_2O_5$. In some examples, any of the materials described herein that comprise a metalloid (Si, C, or B), a first metal of Groups IV, V, VI, VIII, IX, and X, cerium, etc., can be selected for use for the resistor, as described herein. A suitable average thickness for the resistor can be from 0.02 microns to 0.5 microns or 0.02 microns to 0.3 microns, though thicknesses outside of this range can also be used. Furthermore, the resistor, as described, can be doped with any material suitable for achieving desired electrical properties, including, but not limited to, resistivity. The resistor is likewise in electrical communication with a pair of conductors 140 positioned on either side of the resistor. These conductors can act as electrodes for the resistor. In this example, the conductors are also applied to the insulating layer, though this arrangement is merely exemplary. The conductors can be of any material suitable for use as conductors, but in one example, the conductors can be aluminum, or an alloy of aluminum and copper.

Furthermore, conductor passivation layers 150, which are also insulating, can be applied to the conductors to prevent contact between the ink 160 and the conductors. A suitable average thickness for the conductors can be from 0.1 micron to 2 microns, and a suitable average thickness for the passivation layers can be from 0.02 micron to 1 micron, though thicknesses outside of this range can also be suitable.

To the resistor 130, a resistor passivation layer 170 can likewise be applied. This film can be relatively thin to relatively thick, e.g., from 50 angstroms to 1 micron, from 50 angstroms to 2500 angstroms, from 50 angstroms to 1000 angstroms, from 100 angstroms to 1000 angstroms, from 100 angstroms to 500 angstroms, from 100 angstroms to 200 angstroms, etc. To the resistor passivation layer is applied a protective layer 180. Tantalum (Ta), or any of the materials described herein that comprise a metalloid (Si, C, or B), a first metal of Groups IV, V, VI, VIII, IX, and X, cerium, etc., can be selected for use for the thin metal protective layer, as described herein.

Insulating materials that can be used for the electrical insulating layer 120, the conductor passivation layers 150, and the resistor passivation layer 170, or any other insulating layer can be $SiO_2$, SiN, $Al_2O_3$, $HfO_2$, $ZrO_2$, or undoped silicate glass, for example. The electrical insulating films or passivation layers, for example, can be formed by thermal oxidation of the resistor or conductors or deposition of an electrically insulating thin film. Also, it is noted that the resistor passivation layer and the conductor passivation layers 150 can be integrated as a single layer, or may remain as separate, adjacent layers. It is noted that many other types or positioning of layers can also be used as would be appreciated by one skilled in the art after considering the present disclosure.

It is noted that, as used in this specification and the appended claims, the singular forms "a," "an," and "the" include plural referents unless the context clearly dictates otherwise.

As used herein, "devoid of" refers to the absence of materials in quantities other than trace amounts, such as impurities.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 5 at % to about 90 at %" should be interpreted to include not only the explicitly recited values of about 5 at % to about 90 at %, but also include individual values and sub-ranges within the indicated range. Thus, included in this numerical range are individual values such as 6 at %, 7.5 at %, and 8 at %, etc., and sub-ranges such as from 5 at %-75 at %, from 7 at %-80 at %, and from 10 at %-85 at %, etc. This same principle applies to ranges reciting only one numerical value. Furthermore, such an interpretation should apply regardless of the breadth of the range or the characteristics being described.

EXAMPLE

The following example illustrates features of the disclosure that are presently known. Thus, this example should not be considered as a limitation of the present technology, but is merely in place to teach how to make compositions of the present disclosure. As such, a representative number of compositions and their method of manufacture are disclosed herein.

Figure 6:
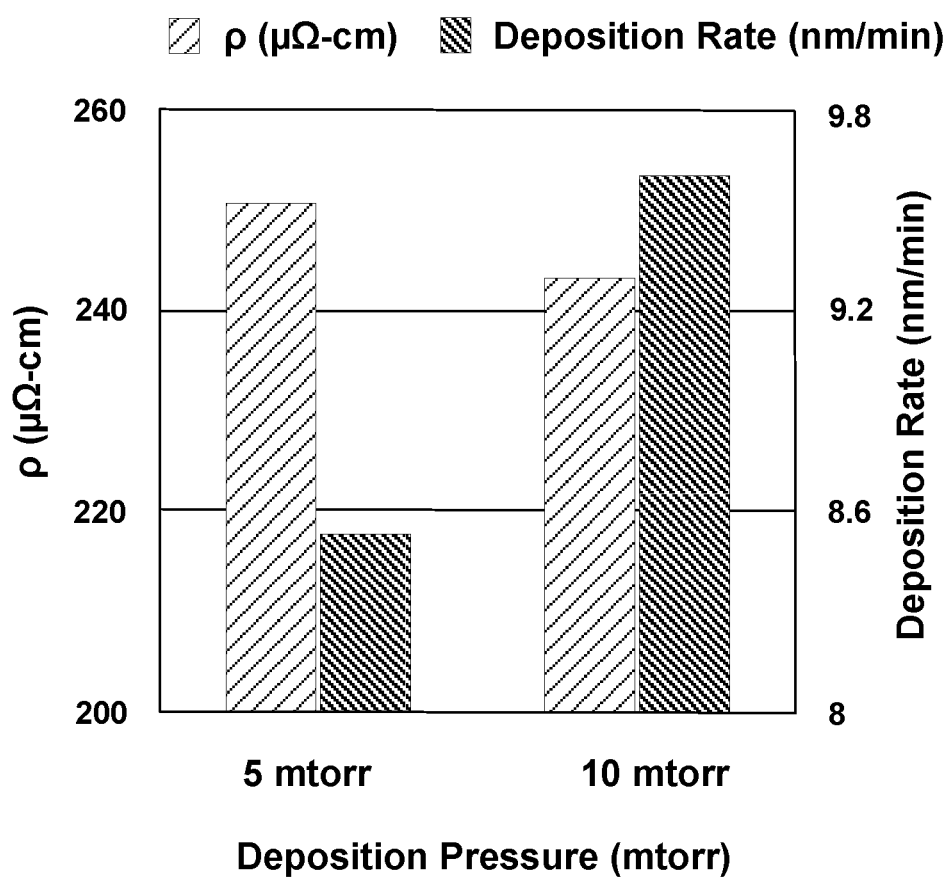
FIG. 6 depicts an example deposition rate and resistivity of two amorphous thin metal films deposited at different deposition temperatures in accordance with the present disclosure.

An amorphous thin metal film was prepared having approximately 30 at % tantalum, 20 at % tungsten, 40 at % silicon, and 10 at % cerium (two metals, one metalloid, and cerium—four components). The materials were deposited via sputter deposition with argon as the sputter gas. One film was deposited at a pressure of 5 millitorr (mtorr) and another was deposited at a pressure of 10 mtorr. As illustrated in FIG. 6, the film deposited at 5 mtorr had a lower deposition rate, but a higher resistivity as compared to the film deposited at 10 mtorr.

Further, these two films were characterized with respect to surface roughness. This was performed using atomic force microscopy (AFM). AFM revealed that the sample deposited at 5 mtorr had an RMS roughness of 0.17 nm, whereas the sample deposited at 10 mtorr had an RMS roughness of only 0.15 nm. Thus, both of the samples had RMS roughness values well below 1 nm, indicating a general lack of grain boundaries typical of a crystalline material.

Figure 7:
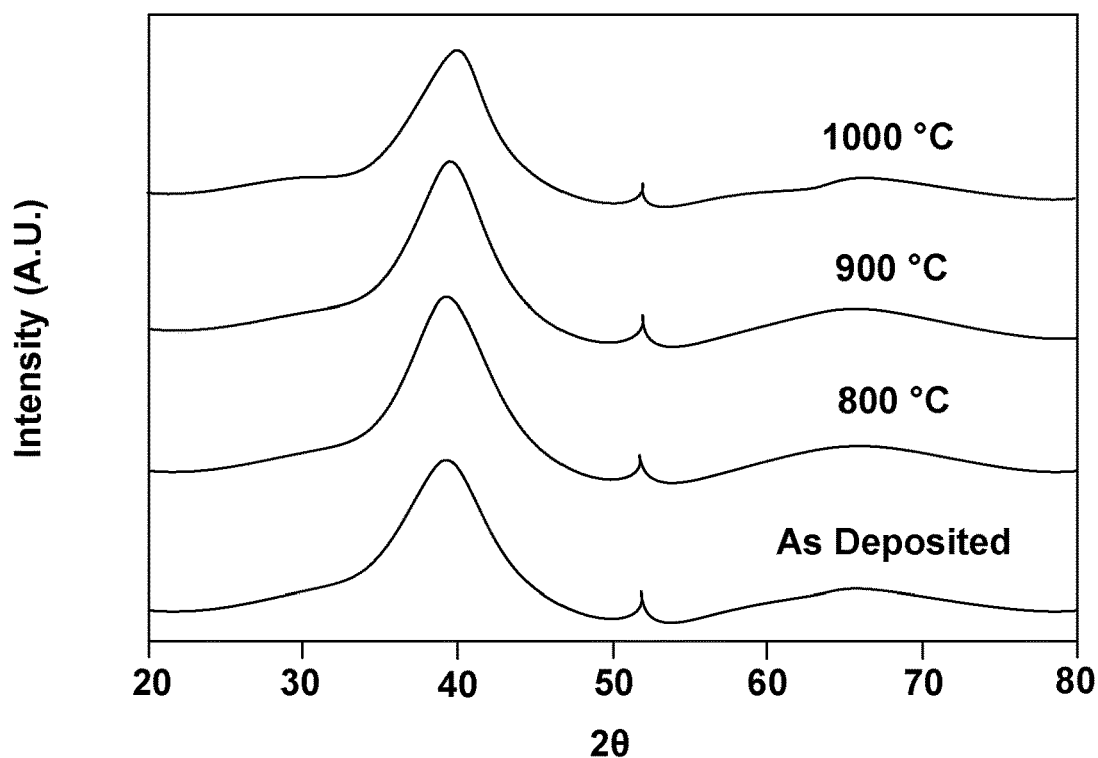
FIG. 7 depicts an example x-ray diffraction pattern at various temperatures of an amorphous thin metal film in accordance with the present disclosure.

The thermal stability of these amorphous films was also tested and found to be comparable. FIG. 7 illustrates a representative example an x-ray diffraction pattern obtained for the amorphous thin metal film exposed to temperatures of 800° C., 900° C., and 1000° C. in a non-oxidative environment for approximately 60 minutes. The graph shows relative patterns or fingerprints for comparative purposes. The x-ray diffraction pattern at each temperature indicates a consistent fingerprint for the thin metal film across each of the temperatures tested, and that the amorphous nature of the thin films is preserved at each of the temperatures.

Figure 8A:
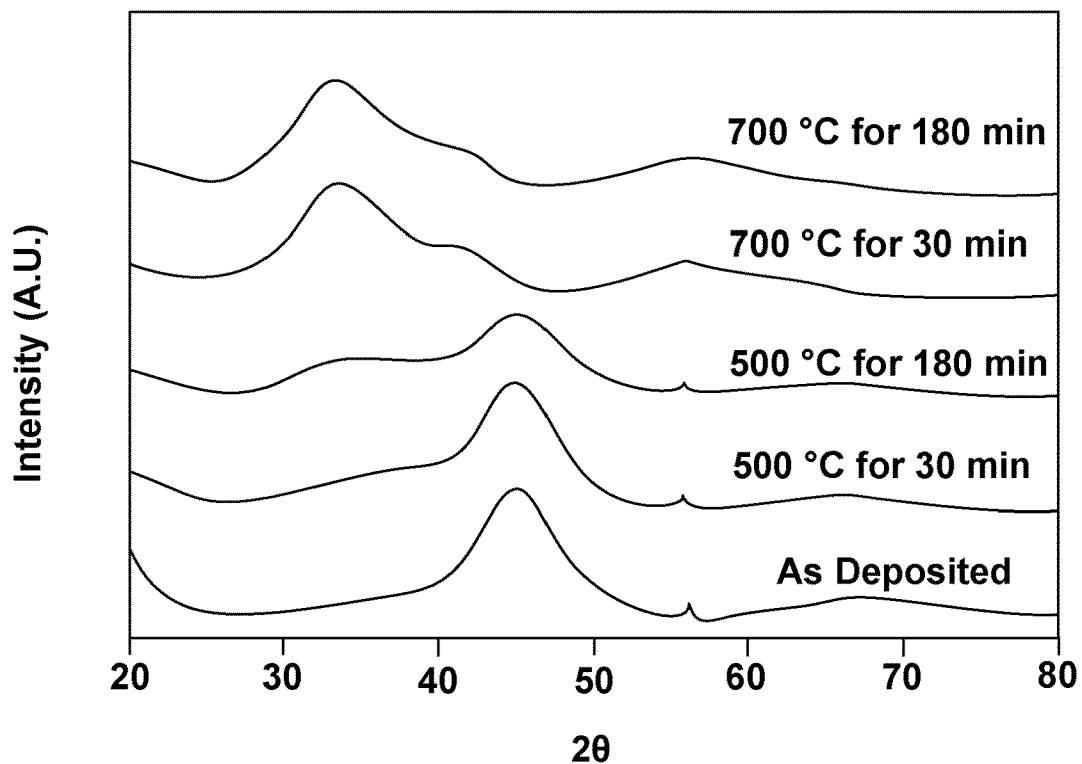
FIG. 8A depicts an example x-ray diffraction pattern at various times and temperatures of an amorphous thin metal film in accordance with the present disclosure.
Figure 8B:
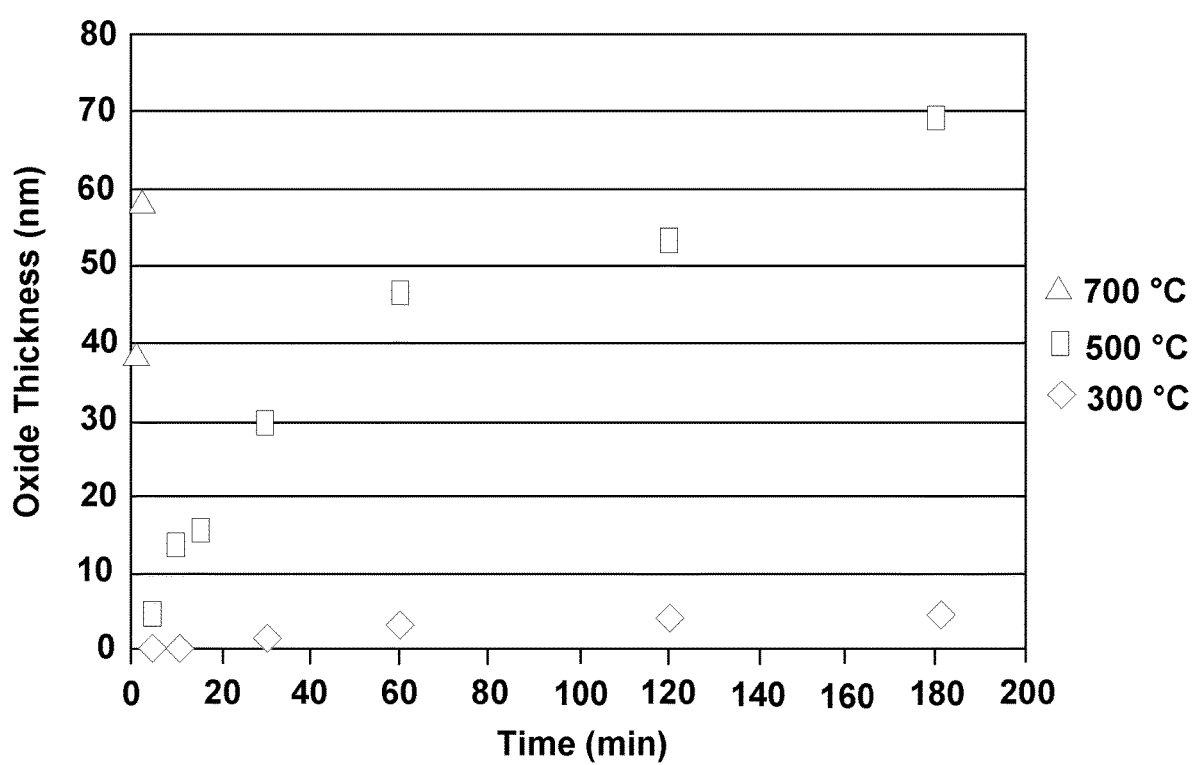
FIG. 8B depicts an example rate of oxidation of an amorphous thin metal film in accordance with an example of the present disclosure.

Additionally, the amorphous thin films were exposed to elevated temperatures in an oxidative environment (i.e. 20% oxygen) to determine resistivity of the thin films to oxidation. As seen in FIGS. 8A-8B, these films were highly resistive to oxidation even at temperatures of 500° C. The graphs show relative patterns or fingerprints for comparative purposes.

This study confirms that an amorphous thin film was prepared with tantalum, tungsten, silicon, and cerium that showed high thermal stability, high resistivity to oxidation, good electrical resistivity, and low surface roughness. For example, the film demonstrated extreme thermal stability by not crystallizing even when heated to 1000° C. The electrical resistivity is in a range suitable for use as a resistor, such as in a thermal inkjet printhead stack. The surface roughness strongly supports the lack of crystal structure in the amorphous thin metal film. All of these attributes combine with the oxidation resistance data to support the high chemical resistance of these materials.

While the present technology has been described with reference to certain examples, those skilled in the art will appreciate that various modifications, changes, omissions, and substitutions can be made without departing from the spirit of the present technology. It is intended, therefore, that the present technology be limited only by the scope of the following claims.

What is claimed is:

1. An amorphous thin metal film, comprising:
   5 at % to 90 at % of a metalloid, wherein the metalloid is carbon, silicon, or boron;
   5 at % to 90 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum; and
   1 at % to 90 at % of cerium,
   wherein the metalloid, the first metal, and cerium account for at least 50 at % of the amorphous thin metal film.

2. The amorphous thin metal film of claim 1, further comprising 5 at % to 90 at % of a second metal, wherein the second metal is titanium, vanadium, chromium, iron, cobalt, nickel, zirconium, niobium, molybdenum, ruthenium, rhodium, palladium, hafnium, tantalum, tungsten, osmium, iridium, or platinum, and wherein the first metal and the second metal are different metals, and wherein the metalloid, the first metal, the second metal, and cerium account for at least 70 at % of the amorphous thin metal film.

3. The amorphous thin metal film of claim 2, wherein the first metal, the second metal, or both include a refractory metal selected from titanium, vanadium, chromium, zirconium, niobium, molybdenum, ruthenium, rhodium, hafnium, tantalum, tungsten, osmium, or iridium.

4. The amorphous thin metal film of claim 1, wherein the amorphous thin metal film has a thickness ranging from 10 angstroms to 100 microns.

5. The amorphous thin metal film of claim 1, further comprising 0.1 at % to 25 at % of a dopant, wherein the dopant is nitrogen, oxygen, or a mixture thereof.

6. The amorphous thin metal film of claim 1, wherein the amorphous thin metal film has a surface RMS roughness of less than 1 nm.

7. A method, comprising depositing the amorphous thin metal film to a substrate, the amorphous thin metal film, comprising:
   5 at % to 90 at % of a metalloid, wherein the metalloid is carbon, silicon, or boron;
   5 at % to 90 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum; and
   1 at % to 90 at % of cerium,
   wherein the metalloid, the first metal, and cerium account for at least 50 at % of the amorphous thin metal film.

8. The method of claim 7, wherein the amorphous thin metal film further comprises a second metal, wherein the second metal is titanium, vanadium, chromium, iron, cobalt, nickel, zirconium, niobium, molybdenum, ruthenium, rhodium, palladium, hafnium, tantalum, tungsten, osmium, iridium, or platinum, and wherein the first metal and the second metal are different.

9. The method of claim 7, wherein the depositing includes sputtering.

10. A thermal inkjet printhead stack with an amorphous thin metal film, comprising:
    an insulated substrate;
    a resistor applied to the insulated substrate;
    a resistor passivation layer applied to the resistor; and
    a protective layer applied to the resistor passivation layer,
    wherein the resistor, the protective layer, or both include the amorphous thin metal film, said amorphous thin metal film, comprising:
      5 at % to 90 at % of a metalloid, wherein the metalloid is carbon, silicon, or boron;
      5 at % to 90 at % of a first metal, wherein the first metal is titanium, vanadium, chromium, iron, cobalt, nickel, zirconium, niobium, molybdenum, ruthenium, rhodium, palladium, hafnium, tantalum, tungsten, osmium, iridium, or platinum; and
      1 at % to 90 at % of cerium,
      wherein the metalloid, the first metal, and cerium account for at least 50 at % of the amorphous thin metal film.

11. The thermal inkjet printhead stack of claim 10, wherein the resistor comprises the amorphous thin metal film.

12. The thermal inkjet printhead stack of claim 11, wherein the resister is applied at a thickness ranging from 0.02 microns to 0.5 microns.

13. The thermal inkjet printhead stack of claim 10, wherein the protective layer comprises the amorphous thin metal film.

14. The thermal inkjet printhead stack of claim 13, wherein the protective layer is applied at a thickness ranging from 0.02 microns to 2 microns.

15. The thermal inkjet printhead stack of claim 10, wherein both the resistor and the protective layer are the amorphous thin metal film, and wherein the resistor and the protective layer are either compositionally identical or compositionally different.

* * * * *